United States Patent [19]

Yamaguchi et al.

[11] Patent Number: 4,921,623

[45] Date of Patent: May 1, 1990

[54] COPPER CONDUCTIVE COATING COMPOSITION

[75] Inventors: Shoji Yamaguchi; Kimiko Yamada; Katsuyoshi Yada; Koichi Sakaguchi; Hiromu Inoue, all of Yokkaichi, Japan

[73] Assignee: Mitsubishi Petrochemical Co., Ltd., Tokyo, Japan

[21] Appl. No.: 222,532

[22] Filed: Jul. 21, 1988

[30] Foreign Application Priority Data

Jul. 24, 1987 [JP] Japan ............................ 62-185280
Sep. 14, 1987 [JP] Japan ............................ 62-230751

[51] Int. Cl.$^5$ .............................................. H01B 1/06
[52] U.S. Cl. ................................... 252/512; 252/500; 523/137; 523/458; 524/439; 524/291
[58] Field of Search ............... 252/512, 500; 523/137, 523/458; 524/439, 291

[56] References Cited

U.S. PATENT DOCUMENTS 4,705,647 10/1987 Yamaguchi et al. ............... 252/512

Primary Examiner—Josephine Barr
Attorney, Agent, or Firm—Oblon, Spivak, McClelland, Maier & Neustadt

[57] ABSTRACT

A copper-type conductive coating composition which comprises:
(A) a copper powder,
(B) a coating binder resin, and
(C) at least one number selected from the group consisting of salicylic acid, its specific derivatives, and benzotriazolecarboxylic acid hydrazides.

The copper-type conductive coating composition provides a conductive coating layer having excellent initial conductivity and capable of maintaining the level of it stable over a long period of the time.

8 Claims, No Drawings

COPPER CONDUCTIVE COATING COMPOSITION

The present invention relates to a copper-type conductive coating composition. More particularly, it relates to an excellent copper-type conductive coating composition which is less susceptible to the reduction of electric conductivity under various environmental conditions.

A conductive coating composition comprises conductive filler powder dispersed in a solution of a thermoplastic resin or thermosetting resin, and it is useful for many purposes, for instance, as a paste for electric circuits, a conductive ink, a conductive adhesive or an electromagnetic wave shielding material.

In recent years, as a result of a rapid expansion of electronic appliances, EMI (Electro Magnetic Interference) has been closed-up as a problem. A technique has been developed to solve this EMI by coating a conductive coating composition. This technique has been commonly known as an EMI shielding technique, and conductive coating compositions have now been commonly used in this field.

The conductive filler to be used for a conductive coating composition includes, for example, gold, silver, copper, nickel, molybdenum and tungsten. Among them, powders of nobel metals such as gold and silver are expensive, and such noble metal powders are used only for conductive coating materials having special purposes. Further, nickel powder is most commonly employed as the conductive filler for conductive coating compositions, particularly for shielding purposes, in view of its conductivity or retention of the conductivity.

On the other hand, the copper powder is inexpensive as compared with the nickel powder, and copper has an electric conductivity about four times that of nickel. Accordingly, it should be possible to advantageously provide at low costs conductive coating compositions by using copper powder as the conductive filler, and there are in fact some which have already been practically used. However, they have a problem that the conductivity lowers abruptly during its use. With respect to the technique for the prevention of the oxidation of the copper powder in conductive coating compositions of this type, various proposals have been made including the one in which phosphite type compound is used (U.S. Pat. No. 4,663,079), the one in which a triazole type compound is used (U.S. Pat. No. 4,705,647).

According to such proposals, some improvements are observed in the storage stability of the coating composition, the moisture resistance, heat resistance and heat cycle resistance of the coating, and the reduction of the formation of patina in the coating composition or on the coating layer. However, they are not necessarily adequate. Thus, it is desired to further improve the initial conductivity and the long-term stability of the initial conductivity.

The present invention provides a copper-type conductive coating composition which comprises:
(A) a copper powder,
(B) a coating binder resin, and
(C) at least one member selected from the group consisting of salicylic acid and its derivatives represented by the formula:

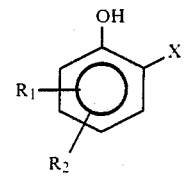

wherein each of $R_1$ and $R_2$ is a hydrogen atom or an group, and X is a —COOH group, a —COH=NOH group, a —CONHNH$_2$ group, a —CONH$_2$ group or a —CH=NOH group, salicylic acid derivatives represented by the formula:

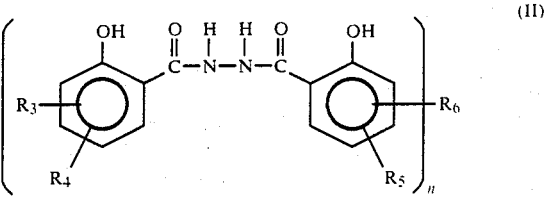

wherein each of $R_3$ to $R_5$ is a hydrogen atom or an alkyl group, $R_6$ is a hydrogen atom, an alkyl group or a hydrocarbon group having a valency of n, and n is an integer of from 1 to 4, and benzotriazolecarboxylic acid hydrazides represented by the formula:

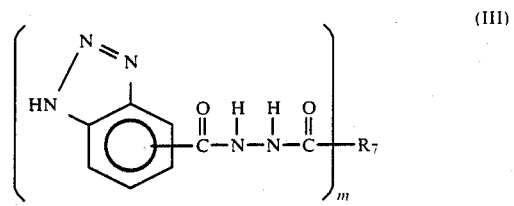

wherein $R_7$ is a carboxylic acid residue having a valency of m, and m is an integer of from 1 to 4.

Further, the present invention provides the copper-type conductive coating composition wherein 9,10-dihydro-9-oxa-10-phosphaphenanthrene-10-oxide is used in combination with the salicylic acid, its derivative, or benzotriazole carboxylic acid hydrazide of the above-mentioned component (C).

The copper-type conductive coating composition of the present invention provides a conductive coating layer having excellent initial conductivity and capable of maintaining the level of the initial conductivity stable over a long period of time.

Now, the present invention will be described in detail with reference to the preferred embodiments.

Copper powder

There is no particular restriction for the preparation of the copper powder to be used in the present invention. The copper powder may be the one obtained by an electrolytic process, the one obtained by an atomizing process, the one obtained by pulverizing process or the one obtained by a reduction process. An electrolytic copper powder is particularly preferred since it gives a coating composition exhibiting high conductivity. The copper powder preferably has a particle size of at most 100 μm. From the viewpoint of the coating properties, it is particularly preferred to employ a copper powder wherein at least 80% by weight is constituted by particles having a particle size of at most 325 mesh (JIS Z-8801). It is possible to employ a combination of two or more different kinds of copper powders prepared by different processes.

An oxidized layer gradually forms on the surface of copper powder during storage of the copper powder. As the copper powder deteriorates by oxidation, it becomes difficult to exhibit the conductivity. However, copper powder which is usually available is the one having a hydrogen loss of at most 1.0% by weight (JSPM Standard 3-63), and it may be used as such for the present invention. However, it is preferred to use copper powder having a hydrogen loss of at most 0.6% by weight, more preferably at most 0.2% by weight.

Further, when the hydrogen loss of copper powder becomes more than 0.2% by weight (JSPM Standard 3-63), particularly more than 0.6% by weight, as the oxidation progresses, it is preferred to treat the copper powder with an organic carboxylic acid to remove the oxidized surface layer before use.

The oxidized surface layer of the copper powder is removed by the treatment with an organic carboxylic acid, whereby copper powder suitable for the present invention can be obtained.

As the organic carboxylic acid to be used, there may be mentioned a monocarboxylic acid such as acetic acid or propionic acid, a non-substituted polycarboxylic acid such as succinic acid or tricarballylic acid, or a hydroxy carboxylic acid such as lactic acid, tartaric acid, gliceric acid, malic acid, citric acid, gluconic acid, tropic acid, benzilic acid, mandelic acid, atrolactinic acid or glycolic acid. Among these organic carboxylic acids, particularly preferred are hydroxy carboxylic acids. The oxidized surface layer of the copper powder can readily be removed by dipping the copper powder in a solution obtained by dissolving such an organic carboxylic acid in a proper solvent, for a predetermined period of time under a stand-still condition or under stirring. As the solvent for the organic carboxylic acid, water or various organic solvents may be employed. However, from the great solvation capacity of the copper ions, water and an alcohol such as methanol, ethanol or propanol are preferred. After the treatment with the organic carboxylic acid, the copper powder is subjected to filtration, washed with water or alcohol and dried.

Binder resin

As a coating binder resin to be used for the coating composition of the present invention, it is possible to use almost all conventional coating binder resins, for instance, thermoplastic resins such as acrylic resins, vinyl resins, cellulose resins and vinyl chloride/vinyl acetate copolymer resins; or thermosetting resins such as epoxy resins, urethane resins, thermosetting acrylic resins, phenol resins, melamine resins or alkyd resins. These binder resins may, if necessary, be used in combination as a mixture of two or more different kinds.

These coating binder resins are usually used together with a suitable organic solvent, particularly in the case where the resins have a high viscosity. As specific examples of the organic solvent, there may be mentioned an aromatic hydrocarbon such as toluene or xylene; an alcohol such as isopropanol or butanol; a ketone such as methyl ethyl ketone or methyl isobutyl ketone; an ester such as ethyl acetate or butyl acetate; or a cellusolve such as ethyl cellusolve or butyl cellusolve. Binder resins may be used alone or in combination as a mixture of two or more different kinds, depending upon the type of the binder resin. Further, in the case where the object to be coated is made of a plastic, it is necessary to take due care so that the solvent does not dissolve the object.

Antioxidant

The afore-mentioned specific salicylic acid and its derivatives incorporated as an antioxidant (C) to the conductive coating composition, include salicylic acid and salicylic acid derivatives such as salicylamide, salicyl hydroxamate, salicyl aldoxime, salicylhydrazide, N,N'-bissalicyloylhydrazine and a poly(N,N'-bissalicyloylhydrazine)alkane, and such salicylic acids with their nucleus substituted by alkyl groups (hereinafter referred to as alkyl-substituted salicylic acids).

Such an alkyl-substituted salicylic acid or its derivative is a compound having alkyl groups at the 3 and 5-positions on the aromatic ring, and the alkyl groups are preferably lower alkyl groups having from 1 to 4 carbon atoms. Specific examples include
3,5-dimethylsalicylic acid, 5-methylsalicylamide,
3-methylsalicylhydroxamic acid, 3-ethylsalicylaldoxime,
3,5-dimethylsalicylhydrazide,
N,N'-bis(3-methylsalicyloyl)hydrazine,
N,N'-bis(5-t-butylsalicyloyl)hydrazine,
N,N'-bis(5-t-octylsalicyloyl)hydrazine,
N,N'-bis(3,5-di-t-butylsalicyloyl)hydrazine and
N,N'-bis(3,5-di-t-amylsalicyloyl)hydrazine.

The hydrocarbon group having a valency of n of a poly(N,N'-bissalicyloylhydrazine)alkane of the formula II wherein n is a plural number, is preferably the one having from 1 to 8 carbon atoms, more preferably a bivalent lower hydrocarbon group having from 1 to 4 carbon atoms. Specifically, di(N,N'-bissalicyloylhydrazine)methane and di[N,N'-bis(3-methylsalicyloyl)hydrazine]ethane may be mentioned.

The afore-mentioned benzotriazolecarboxylic acid hydrazides of the formula III are hydrazides of benzotriazolecarboxylic acid with an aliphatic monobasic or polybasic carboxylic acid which may be substituted by various substituents, and are preferably hydrazides of a monobasic or dibasic carboxylic acid. Specifically, there may be mentioned benzotriazolecarboxylic acid stearoyl hydrazide, benzotriazolecarboxylic acid salicyloyl hydrazide and dodecane diacid bis(benzotriazolecarbonylhydrazide).

In the present invention, the antioxidant incorporated as component (C) may be used in combination with a 9,10-dihydro-9-oxa-10-phosphaphenanthrene-10-oxide, whereby the properties of the coating layer will be further improved. The 9,10-dihydro-9-oxa-10-phosphaphenanthrene-10-oxide is an organic phosphorus compound having the formula:

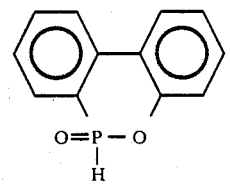

It may be the one with up to 3 hydrogen atoms on the aromatic rings substituted by halogen atoms or hydrocarbon groups. Specifically, there may be mentioned 9,10-dihydro-9-oxa-10-phosphaphenanthrene-10-oxide, 9,10-dihydro-1-cyclohexyl-9-oxa-10-phosphaphenanthrene-10oxide, 9,10-dihydro-3-(α,α-dimethylbenzyl)-9- oxa-10-phosphaphenanthrene-10-oxide and 9,10-dihydro-3-t-butyl-9-oxa-10-phosphaphenanthrene-10-oxide.

Blending

The conductive coating composition of the present invention may be formulated in any desired type such as a one-pack quick drying type composition in which e.g. a thermoplastic acrylic resin is used as the binder resin, or a two-pack type composition wherein e.g. a urethane resin or epoxy resin is employed.

The proportion of the copper powder for the preparation of the conductive coating composition of the present invention is from 10 to 90% by weight, preferably from 30 to 70% bt weight, relative to the coating composition, and it is desired to select the proportion so that the conductivity of the coating layer of the composition becomes to be the maximum, and yet the conductivity is maintained for a long period of time.

The proportion of the antioxidant for the present invention is usually within a range of from 0.01 to 5% by weight, preferably from 0.1 to 2% by weight, relative to the copper powder, depending upon the type of the antioxidant or the use of the coating composition.

When the above-mentioned organic phosphorus compound is used in combination, it is used within a range of from 0.01 to 5% by weight, preferably from 0.05 to 2% by weight, relative to the copper powder.

The representative proportions for a conductive coating composition for spray coating or brush coating, are within the following ranges:
(A) from 5 to 20% by weight of a binder resin;
(B) from 40 to 60% by weight of the copper powder;
(C) from 0.01 to 5% by weight of the antioxidant; and
(D) from 20 to 55% by weight of an organic solvent.

In addition to the above-mentioned various components, it is possible to incorporate various additives to the conductive coating composition of the present invention, as the case requires. Particularly, for the prevention of the sedimentation of the copper powder, it is advisable to incorporate various sedimentation-preventing agents such as thickening agents or thixotropic thickeners in an amount not to impair the electric conductivity. As such sedimentation-preventing agents, there may be mentioned, for instance, hydrogenated castor oil, a metallic soap, an aluminum chelate, an organic bentonite, a colloidal silica, an oxidized polyethylene wax, a long chain polyamino amide, and a polycarboxylic acid alkyl amine.

Particularly preferred sedimentation-preventing agents are aliphatic amides represented by the formula $RCONH_2$ or $(RCONH)_2A$, wherein R is a $C_5$-$C_{21}$ alkyl group, and A is a $C_1$-$C_6$ alkylene group, or a mixture of such an aliphatic amide with a wax. As specific examples of such aliphatic amides, there may be mentioned monoamides such as oleic acid amide, capronic acid amide, linolic acid amide and behenic acid amide; or bis-amides such as N,N'-methylene-bis-stearic acid amide and N,N'-ethylene-bis-stearic acid amide. Further, as a mixture of the aliphatic amide and the wax, there may be mentioned a mixture obtained by pulverizing the above-mentioned bis-amide and a polyolefin wax having a molecular weight of from 1000 to 9000 together (Japanese Unexamined Patent Publication No. 65056/1981). These sedimentation-preventing agents may be used alone or in combination as a mixture of two or more different kinds.

Preparation

For the preparation of the conductive coating composition of the present invention, the above-mentioned binder resin, the copper powder, the antioxidant, the solvent, and various other necessary additives are suitably mixed, and formed into a coating composition by means of a dispersing device commonly employed for the preparation of the coating compositions (such as a disper, a ball mill, a sand mill, a triple rolls, or a Foover's Muller). The conductive coating composition of the present invention thus obtained, may be coated or printed on an object by a suitable method such as spraying, brush coating, dipping, off-set printing or screen printing, to obtain an excellent conductive coating layer having remarkably high electric conductivity, which is yet less susceptible to the reduction of the conductivity and to the formation of patina.

Now, the present invention will be described in further detail with reference to Examples and Comparative Examples. In these Examples, "parts" means "parts by weight", and "%" means "% by weight". It should be understood that the present invention is by no means restricted by these specific Examples.

The volume resistivity indicated in these Examples, was measured in accordance with the following method. Along the center portion of a copper-lined laminated plate of glass-reinforced epoxy resin having a width of 5 cm and a length of 10 cm and provided at both ends with copper foil portions of 1.5 cm in width, a conductive coating composition was coated in a width of 1 cm in the longitudinal direction of this plate to connect the copper foil portions at both ends, whereby a test piece was obtained. The coating layer of the test piece thus formed was left under various environmental conditions for a predetermined period of time, whereupon the thickness of the coating layer was measured by a digital micrometer (Degimatic Indicator 543, manufactured by Kabushiki Kaisha Mitoyo Seisakusho), and the electric resistance was measured by a Wheatstone's bridge (Type 2755, manufactured by Yokogawa Electric Works, Ltd.), and the volume resistivity was calculated in accordance with the following equation.

$$\text{Volume resistivity } (\Omega \cdot cm) = \frac{\text{Measured resistance } (\Omega) \times \text{thickness (cm)} \times \text{width (cm)}}{\text{Length (cm)}} = \frac{\text{Measured resistance} \times \text{thickness} \times 1}{7}$$

EXAMPLE 1

To 100 parts of a commercially available electrolytic copper powder for industrial use (325 mesh pass at least 80%; hydrogen loss: 0.51% by weight), 400 parts of a 10% citric acid aqueous solution was added, and after stirring 15 hours by a stirrer, the mixture was filtered to separate the copper powder. The copper powder was thoroughly washed with water and dried.

To 100 parts of the copper powder thus obtained, 1 part of salicylhydroxamic acid (manufactured by Wako Junyaku Co.), 100 parts of a 40% toluene solution of a commercially available polymethyl methacrylate (molecular weight: about 100,000, manufactured by Wako Junyaku Co.) and 60 parts of methyl ethyl ketone were added, and the mixture was dispersed by a high speed disper to obtain a conductive coating composition.

A test piece which is a laminated plate coated with this coating composition was left at 23° C. under a relative humidity of 50% for 24 hours, whereupon the volume resistivity was measured and found to be $1.5 \times 10^{-4} \Omega.cm$. Further, this coating layer was left in heated air of 85° C. for 1000 hours, whereupon the volume resistivity was measured and found to be $3.8 \times 10^{-4} \Omega.cm$. Further, the coating layer of the coating composition was left at 66° C. under a relative humidity of 90% for 1000 hours, whereupon the volume resistivity was measured in the same manner and found to be $2.5 \times 10^{-4} \Omega.cm$.

Further, the coating composition was stored at 23° C. for 1000 hours, and then applied onto the laminated plate to form a coating layer. This coating layer was left at 23° C. under a relative humidity of 50% for 24 hours, whereupon the volume resistivity was measured and found to be $2.9 \times 10^{-4} \Omega.cm$.

EXAMPLE 2

To 100 parts of a commercially available electrolytic copper powder for industrial use (325 mesh pass at least 80%; hydrogen loss: 0.16% by weight), one part of salicylhydroxamic acid, 100 parts of a 40% toluene solution of an acrylic resin (Dianal BR-73, tradename, manufactured by Mitsubishi Rayon Co., Ltd.), 60 parts of methyl ethyl ketone, and 2 parts of Ceridust 9615A (tradename for an amide-modified wax, manufactured by Hechest Co.) were added, and the mixture was dispersed by a high speed disper to obtain a conductive coating composition.

This coating composition was coated in the same manner as in Example 1, and left in the same manner, whereupon the volume resistivity was measured. The results are shown in Table 1.

EXAMPLE 3

A conductive coating composition was prepared in the same manner as in Example 1 except that salicylic acid was used instead of salicylhydroxamic acid.

EXAMPLE 4

A conductive coating composition was prepared in the same manner as in Example 1 except that salicylamide was used instead of salicylhydroxamic acid.

EXAMPLE 5

A conductive coating composition was prepared in the same manner as in Example 1 except that salicylaldoxime was used instead of salicylhydroxamic acid.

EXAMPLE 6

A conductive coating composition was prepared in the same manner as in Example 1 except that salicylhydrazide was used instead of salicylhydroxamic acid.

EXAMPLE 7

A conductive coating composition was prepared in the same manner as in Example 1 except that N,N'-bis-salicyloylhydrazine (MARK CDA-8, tradename, manufactured by Adeca Argus Chemical) was used instead of salicylhydroxamic acid.

EXAMPLE 8

A conductive coating composition was prepared in the same manner as in Example 2 except that N,N'-bis-salicyloylhydrazine (MARK CDA-8) was used instead of salicylhydroxamic acid.

EXAMPLE 9

A conductive coating composition was prepared in the same manner as in Example 7 except that succinic acid was used instead of citric acid.

COMPARATIVE EXAMPLE 1

A conductive coating composition was prepared in the same manner as in Example 1 except that the copper powder was used as it was without the treatment with citric acid and no salicylhydroxamic acid was incorporated.

COMPARATIVE EXAMPLE 2

A conductive coating composition was prepared in the same manner as in Example 1 except that the copper powder treated with citric acid was used and no salicylhydroxamic acid was incorporated.

COMPARATIVE EXAMPLE 3

A conductive coating composition was prepared in the same manner as in Example 1 except that 3-(N-salicyloyl)amino-1,2,4-triazole (MARK CDA-1, tradename, manufactured by Adeca Argus Chemical) was used instead of salicylhydroxamic acid.

COMPARATIVE EXAMPLE 4

A conductive coating composition was prepared in the same manner as in Example 1 except that salicylanilide was used instead of salicylhydroxamic acid.

COMPARATIVE EXAMPLE 5

A conductive coating composition was prepared in the same manner as in Example 1 except that salicylaldehyde was used instead of salicylhydroxamic acid.

With respect to the conductive coating compositions obtained in Examples 2 to 9 and Comparative Examples 1 to 5, tests were conducted in the same manner as in Example 1. The test results are shown in Table 1.

TABLE 1

| | Copper powder | | | Environmental resistance of coating layer *4 ($\Omega \cdot cm$) | | | Storage stability of coating composition *5 Storage for 1000 hrs |
|---|---|---|---|---|---|---|---|
| | Hydrogen loss (%) | Acid treatment | Antioxidant | 23° C. 24 hrs | 85° C. 1000 hrs | 66° C. 90% 1000 hrs | Drying at 23° C. for 24 hrs. |
| Example 1 | 0.51 | Citric acid | Salicylhydroxamic acid *1 | $1.5 \times 10^{-4}$ | $3.8 \times 10^{-4}$ | $2.5 \times 10^{-4}$ | $2.9 \times 10^{-4}$ |
| Example 2 | 0.16 | Nil | Salicylhydroxamic acid *1 | $1.4 \times 10^{-4}$ | $3.6 \times 10^{-4}$ | $2.3 \times 10^{-4}$ | $2.5 \times 10^{-4}$ |
| Example 3 | 0.51 | Citric acid | Salicylic acid *1 | $2.1 \times 10^{-4}$ | $4.3 \times 10^{-4}$ | $2.9 \times 10^{-4}$ | $7.9 \times 10^{-4}$ |
| Example 4 | 0.51 | Citric | Salicylamide | $3.0 \times 10^{-4}$ | $3.8 \times 10^{-4}$ | $3.1 \times 10^{-4}$ | $8.0 \times 10^{-4}$ |

TABLE 1-continued

| | Copper powder | | | Environmental resistance of coating layer *4 ($\Omega \cdot cm$) | | | Storage stability of coating composition *5 Storage for 1000 hrs |
|---|---|---|---|---|---|---|---|
| | Hydrogen loss (%) | Acid treatment | Antioxidant | 23° C. 24 hrs | 85° C. 1000 hrs | 66° C. 90% 1000 hrs | Drying at 23° C. for 24 hrs. |
| Example 5 | 0.51 | Citric acid | Salicylaldoxime *1 | $2.9 \times 10^{-4}$ | $5.8 \times 10^{-4}$ | $3.2 \times 10^{-4}$ | $9.0 \times 10^{-4}$ |
| Example 6 | 0.51 | Citric acid | Salicylhydrazide *2 | $2.3 \times 10^{-4}$ | $4.5 \times 10^{-4}$ | $2.0 \times 10^{-4}$ | $1.0 \times 10^{-3}$ |
| Example 7 | 0.51 | Citric acid | MARK CDA-8 *3 | $1.8 \times 10^{-4}$ | $2.5 \times 10^{-4}$ | $2.3 \times 10^{-4}$ | $1.9 \times 10^{-4}$ |
| Example 8 | 0.16 | Nil | MARK CDA-8 *3 | $1.5 \times 10^{-4}$ | $2.3 \times 10^{-4}$ | $2.2 \times 10^{-4}$ | $1.6 \times 10^{-4}$ |
| Example 9 | 0.51 | Succinic acid | MARK CDA-8 *3 | $1.9 \times 10^{-4}$ | $2.4 \times 10^{-4}$ | $2.4 \times 10^{-4}$ | $2.3 \times 10^{-4}$ |
| Comparative Example 1 | 0.51 | Nil | Nil | $5.8 \times 10^{-2}$ | $2.0 \times 10^{0}$ | at least $4.0 \times 10^{4}$ | at least $4.0 \times 10^{4}$ |
| Comparative Example 2 | 0.51 | Citric acid | Nil | $8.1 \times 10^{-4}$ | $5.2 \times 10^{-3}$ | $4.8 \times 10^{-3}$ | $8.2 \times 10^{-3}$ |
| Comparative Example 3 | 0.51 | Citric acid | MARK CDA-1 *3 | $7.4 \times 10^{-4}$ | $7.8 \times 10^{-3}$ | $8.3 \times 10^{-4}$ | $8.5 \times 10^{-4}$ |
| Comparative Example 4 | 0.51 | Citric acid | Salicylanilide *1 | $1.4 \times 10^{-3}$ | $1.5 \times 10^{-2}$ | $2.0 \times 10^{-3}$ | $2.7 \times 10^{-3}$ |
| Comparative Example 5 | 0.51 | Citric acid | Salicylaldehyde *1 | $8.2 \times 10^{-4}$ | $9.0 \times 10^{-3}$ | $1.4 \times 10^{-3}$ | $2.5 \times 10^{-3}$ |

*1: Reagent, manufactured by Wako Junyaku Co.
*2: Reagent, manufactured by ALDRICH Company
*3: Tradename, manufactured by Adeca Argus Chemical Co.
*4: A coating layer was formed and left under each environmental condition, and then, the volume resistivity thereof was measured.
*5: A coating composition was stored at 23° C. under a relative humidity of 50% for 1000 hours, then a test piece was prepared therefrom, and the volume resistivity was measured.

EXAMPLE 10

A conductive coating composition was prepared in the same manner as in Example 7 except that the copper powder was used as it was without the treatment with citric acid.

EXAMPLE 11

A conductive coating composition was prepared in the same manner as in Example 7 except that in addition to one part of MARK CDA-8, one part of 9,10-dihydro-9-oxa-10-phosphaphenanthrene-10-oxide (HCA, manufactured by Sanko Kagaku K.K.) was used.

EXAMPLE 12

A conductive coating composition was prepared in the same manner as in Example 1 except that methylene-bissalicylic acid bis(salicyloylhydrazide) was used instead of salicylhydroxamic acid.

EXAMPLES 13 to 15

Conductive coating compositions were prepared in the same manner as in Example 1 except that instead of salicylhydroxamic acid, benzotriazolecarboxylic acid salicyloylhydrazide (Example 13), benzotriazolecarboxylic acid stearoylhydrazide (Example 14) and dodecane diacid bis(benzotriazolecarbonylhydrazide) (Example 15) were used, respectively.

EXAMPLE 16

A conductive coating composition was prepared in the same manner as in Example 1 except that the copper powder was used as it was without the treatment with citric acid.

With respect to the coating compositions obtained in Examples 10 to 16, tests were conducted in the same manner as in Example 1. The test results are shown in Table 2.

TABLE 2

| | Copper powder | | | Environmental resistance of coating layer *4 ($\Omega \cdot cm$) | | Storage stability of coating composition *5 Storage for 1000 hrs |
|---|---|---|---|---|---|---|
| | Hydrogen Loss (%) | Acid treatment | Antioxidant | 23° C. 24 hrs | 85° C. 1000 hrs | Drying at 23° C. for 24 hrs. |
| Example 10 | 0.51 | Nil | MARK CDA-8 | $5.0 \times 10^{-4}$ | $9.0 \times 10^{-4}$ | $6.5 \times 10^{-4}$ |
| Example 11 | 0.51 | Citric acid | MARK CDA-8/ HCA | $1.5 \times 10^{-4}$ | $2.6 \times 10^{-4}$ | $1.7 \times 10^{-4}$ |
| Example 12 | 0.51 | Citric acid | Methylene-bissalicylic acid bis(salicyloylhydrazide) | $3.7 \times 10^{-4}$ | $5.0 \times 10^{-4}$ | $3.5 \times 10^{-4}$ |
| Example 13 | 0.51 | Citric acid | Benzotriazolecarboxylic acid salicyloylhydrazide | $6.7 \times 10^{-4}$ | $1.2 \times 10^{-3}$ | $5.1 \times 10^{-4}$ |
| Example 14 | 0.51 | Citric acid | Benzotriazolecarboxylic acid stearoylhydrazide | $6.0 \times 10^{-4}$ | $8.0 \times 10^{-4}$ | $7.8 \times 10^{-4}$ |
| Example 15 | 0.51 | Citric | Dodecane diacid | $5.0 \times 10^{-4}$ | $6.5 \times 10^{-4}$ | $7.0 \times 10^{-4}$ |

TABLE 2-continued

| | Copper powder | | | Environmental resistance of coating layer *4 ($\Omega \cdot cm$) | | Storage stability of coating composition *5 Storage for 1000 hrs |
|---|---|---|---|---|---|---|
| | Hydrogen Loss (%) | Acid treatment | Antioxidant | 23° C. 24 hrs | 85° C. 1000 hrs | Drying at 23° C. for 24 hrs. |
| Example 16 | 0.51 | acid Nil | bis(benzotri-azolecarbonyl-hydrazide) Salicyl-hydroxamic acid | $5.3 \times 10^{-4}$ | $9.2 \times 10^{-4}$ | $7.0 \times 10^{-4}$ |

We claim:

1. A copper conductive coating composition which comprises:
   (A) from 10 to 90% by weight of a copper powder,
   (B) from 10 to 90% by weight of a coating binder resin, and
   (C) from 0.01 to 5% by weight of at least one member selected from the group consisting of salicylic acid or its derivatives represented by the formula:

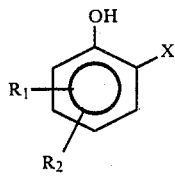

wherein each of $R_1$ and $R_2$ is a hydrogen atom or a $C_{1-4}$ alkyl group, and X is a —COOH group, a —COH=NOH group, —CONHNH$_2$ group, a —CONH$_2$ group or a —CH=NOH group, salicyclic acid dreivatives represented by the formula:

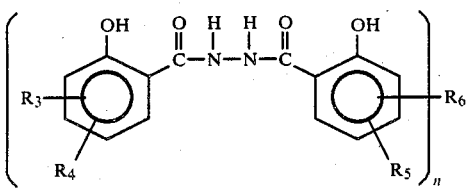

wherein each of $R_3$ to $R_5$ is a hydrogen atom or a $C_{1-8}$ alkyl group, $R_6$ is a hydrogen atom or a $C_{1-8}$ hydrocarbon group having a valency of n, and n is an integer of from 1 to 4, and benzotriazolecarboxylic acid hydrazides represented by the formula:

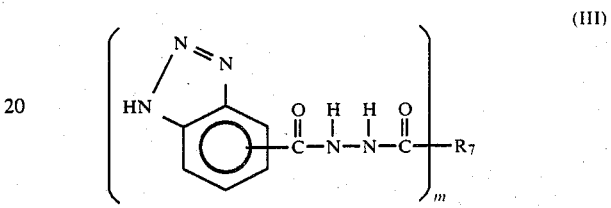

wherein $R_7$ is a carboxylic acid residue having a valency of m, and m is an integer of from 1 to 4.

2. The copper conductive coating composition according to claim 1, wherein the copper powder has a hydrogen loss of at most 0.6% by weight.

3. The copper conductive coating composition according to claim 2, wherein the copper powder has a hydrogen loss of at most 0.2% by weight.

4. The copper conductive coating composition according to claim 1, wherein the copper powder is treated with a carboxylic acid.

5. The copper conductive coating composition according to claim 4, wherein the carboxylic acid is citric acid.

6. The copper conductive coating composition according to claim 1, wherein component (C) is a salicylic acid or its derivative of the formula I or II.

7. The copper conductive coating composition according to claim 6, wherein the salicylic acid derivative is a bissalicyloylhydrazine of the formula II.

8. The copper conductive coating composition according to claim 1, wherein a 9,10-dihydro-9-oxa-10-phsophaphenanthrene-10-oxide is used in combination with component(C).

* * * * *